(12) United States Patent  
Nomiyama et al.

(10) Patent No.: US 7,714,363 B2
(45) Date of Patent: May 11, 2010

(54) SEMICONDUCTOR INTEGRATED CIRCUIT FOR DRIVING THE ADDRESS OF A DISPLAY DEVICE

(75) Inventors: Takahiro Nomiyama, Matsumoto (JP); Gen Tada, Matsumoto (JP); Yoshihiro Shigeta, Matsumoto (JP)

(73) Assignee: Fuji Electric Device Technology Co., Ltd. (JP)

( * ) Notice: Subject to any disclaimer, the term of this patent is extended or adjusted under 35 U.S.C. 154(b) by 35 days.

(21) Appl. No.: 11/861,074

(22) Filed: Sep. 25, 2007

(65) Prior Publication Data

US 2008/0083937 A1 Apr. 10, 2008

(30) Foreign Application Priority Data

Oct. 6, 2006 (JP) ............................ 2006-275482

(51) Int. Cl.
*H01L 23/52* (2006.01)
(52) U.S. Cl. ................ 257/211; 257/691; 257/E23.079; 257/E23.153
(58) Field of Classification Search .................. 257/499, 257/773, 776, 211, 691, E23.079, E23.153; 345/211
See application file for complete search history.

(56) References Cited

U.S. PATENT DOCUMENTS 4,885,628 A * 12/1989 Nagai et al. .................. 257/500

5,821,587 A 10/1998 Jeong
2006/0060986 A1 * 3/2006 Kim et al. .................... 257/786

FOREIGN PATENT DOCUMENTS

| JP | 06-244235 A | 9/1994 |
| JP | 10-084083 A | 3/1998 |
| JP | 2006-227650 A | 8/2006 |

OTHER PUBLICATIONS

T. Nomiyama et al.; "New 256-ch PDP Address Driver IC with Reducing Switching Noise"; International Display Workshop '05; pp. 453-456; Matsumoto-shi, Nagano Japan.

* cited by examiner

*Primary Examiner*—Minh-Loan T Tran
(74) *Attorney, Agent, or Firm*—Rossi, Kimms & McDowell LLP

(57) ABSTRACT

Wiring of a PDP address driver IC is disclosed which affords an adequate permitted current capacity. In the PDP address driver IC that drives the PDP, a layer, in which a planar high voltage ground wiring layer and a planar high voltage power wiring layer are formed, is provided atop a layer in which planar high voltage ground wiring layers that supply a ground potential to the active element that is formed within the PDP address driver IC and in which planar high voltage power wiring layers that supply a source potential to the active element are formed. Accordingly, the PDP address driver IC can comprise an adequate permitted current capacity while maintaining a compact size and comprising a multiplicity of output bit portions.

16 Claims, 7 Drawing Sheets

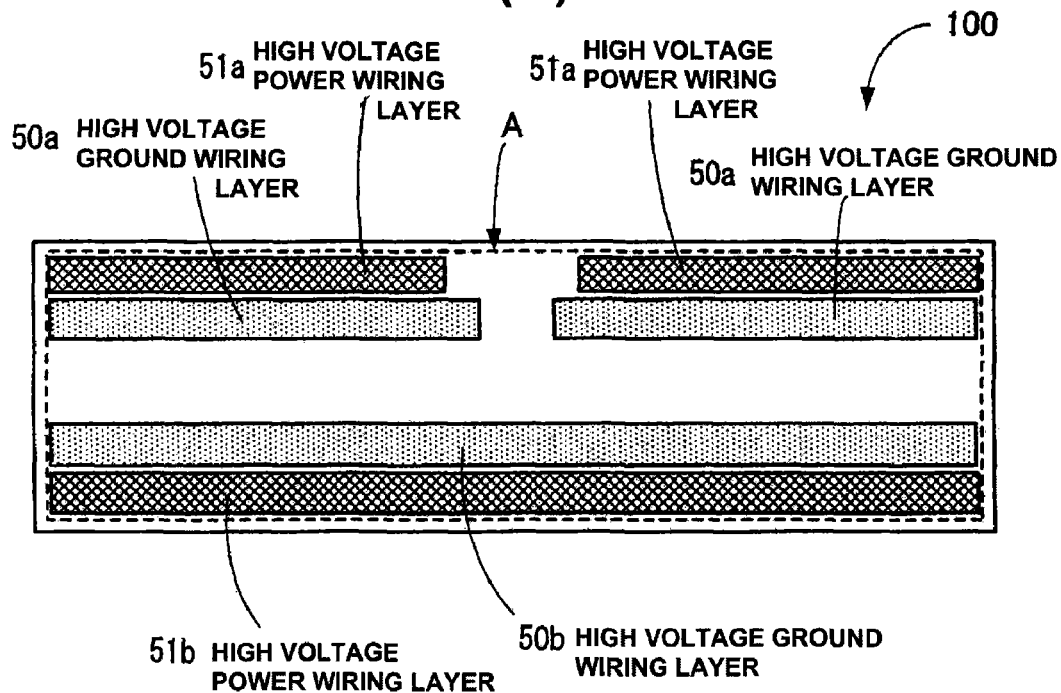
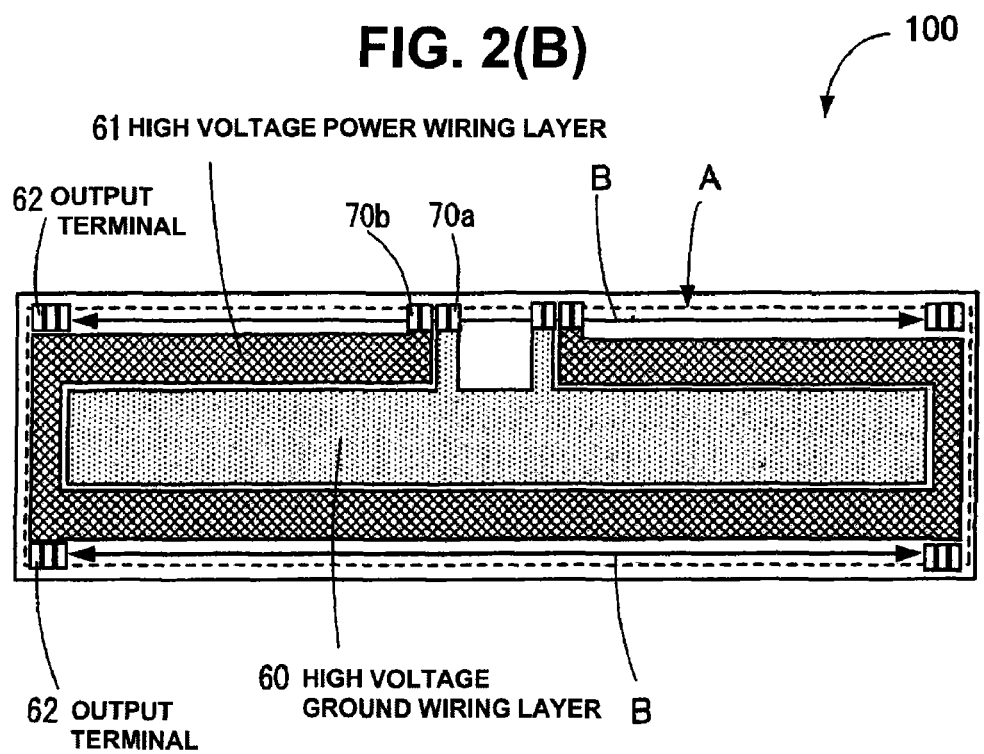

Prior Art

SEMICONDUCTOR INTEGRATED CIRCUIT FOR DRIVING THE ADDRESS OF A DISPLAY DEVICE

CROSS REFERENCE TO RELATED APPLICATIONS

This application claims priority from Japanese application Serial No. 2006-275482, filed on Oct. 6, 2006, the contents of which are incorporated by reference in their entirety.

BACKGROUND OF THE INVENTION

A. Field of the Invention

The present invention relates to a semiconductor integrated circuit, and, in particular, to a semiconductor integrated circuit which drives the addressing of a display device.

B. Description of the Related Art

Integrated circuits (IC) which control the addressing of Plasma Display Panels (PDP) include PDP address driver ICs. PDP address driver ICs generally have a high operational voltage of 50 volts or more, an instantaneous current of 5 amps or more, and a large consumption current of 300 mA or more, and comprise a multiplicity of 100 or more output bit portions.

Recently, in order to miniaturize PDP address driver ICs that comprise a multiplicity of output bit portions, semi-slim-type PDP address driver ICs have been developed (for an example, see T. Nomiyama, K. Kawamura, A. Fukuchi, K. Sato, Y. Shigeta, and G. Tada, "New 256-ch PDP Address Driver IC with Reducing Switching Noise" Proc. of International Display Workshop/Asia Display (IDW/AD'05), pages 453 to 456(2005)). See FIG. 5 for an example of a layout for a semi-slim type PDP address driver IC. FIG. 5 is a principal part view illustrating the layout of a PDP address driver IC which affords a planar view of the PDP address driver IC as seen from above.

The PDP address driver IC 200 comprises amplifier circuit section 201 at the center thereof and has a plurality of external connection terminals arranged at both ends thereof. Taking first edge 202 as an example, input terminal 203, as well as high voltage ground terminal 204 and high voltage power terminal 205 are disposed at the center of edge 202. Furthermore, high voltage ground terminal 204 and high voltage power terminal 205 are connected to high voltage ground wiring 206 and high voltage power wiring 207 respectively, and high voltage ground wiring 206 and high voltage power wiring 207 are arranged so as to extend within the plane of PDP address driver IC 200.

Incidentally, PDP address driver IC 200 actually has a postero-anterior orientation in FIG. 5 and is formed by metal wiring in a laminated structure (a multi-layered wiring structure), high voltage ground wiring 206 and high voltage power wiring 207 being pattern-formed on the uppermost layer of PDP address driver IC 200. For instance, if the laminated structure is a three layer structure, high voltage ground wiring 206 and high voltage power wiring 207 are positioned in the third layer, and wiring such as the signal wiring (not shown) from the logic circuit, and the wiring connected to the output terminal of the high-withstand voltage circuit (not shown) are laid in a complicated arrangement in the layer below the third layer.

Moreover, in the layer below high voltage ground wiring 206 and high voltage power wiring 207, output bit portions 208 are arranged without a gap in a linear manner in the range indicated by arrow C. A signal that enters through input terminal 203, which is formed in the third wiring layer, passes through amplifier circuit section 201, and after going through signal processing in an internal circuit, is transmitted to output bit portion 208, where it is output from output terminal 209, which is formed in the third wiring layer. This signal then designates an address of the panel (not shown).

In the same manner, for the semi-slim type PDP address driver IC 200 shown in FIG. 5, in order to miniaturize the PDP address driver IC, output bit portions 208 are arranged without a gap in a linear manner on both sides of PDP address driver IC 200. Further, high voltage ground wiring 206 is formed in the layer above all of output bit portions 208.

Next, the constitution of output bit portion 208 will be described. FIG. 6 provides principal part views illustrating the constitution of the output bit portions, where FIG. 6A is a layout diagram of the output bit portions and FIG. 6B is a constitutional view of the circuit of an output bit portion.

As shown in FIG. 6A, for output bit portions 208, the high-withstand voltage circuit section that outputs a signal to the panel is disposed in the region indicated by arrow D, and the logic circuit section that controls the high-withstand voltage circuit section is disposed as a set in the region indicated by arrow E. The above-mentioned high voltage ground wiring 206 and high voltage power wiring 207 are then arranged in the layer above the high withstand voltage circuit. Further, though it is not shown in FIG. 5, logic ground wiring 210 that supplies a ground potential to the logic circuit section is laid in the layer above the logic circuit section. Further, logic power source wiring 211 that supplies a predetermined voltage to the logic circuit section is also laid here.

As shown in FIG. 6B, the high-withstand voltage circuit section is constituted comprising a level shifter circuit that is constituted by active elements P1, P2, N1, and N2, as well as an output circuit that is constituted by active elements P3 and N3. Here, the level shifter circuit is a circuit that receives a signal from the logic circuit section and converts this signal into a high voltage signal. The output circuit outputs either the source potential or the ground potential, depending on the signal from the logic circuit section. Thus, output bit portions 208 comprise a high-withstand voltage section and a logic circuit section, and are arranged without a gap, in a linear manner, at both ends of PDP address driver IC 200 in the longitudinal direction thereof.

In recent years, there has been a trend towards reducing the number of PDP address driver ICs on each PDP module in order to reduce the overall cost of the PDP module. When the number of PDP address driver ICs on each PDP module is reduced, it is necessary to increase the number of output bit portions of each PDP address driver IC in order to maintain the output performance of each PDP module. For example, currently, PDP modules predominantly each have 256 output bit portions, but the next-generation PDP modules are tending to move towards having 384 or more output bit portions.

However, if the number of output bit portions provided in an individual PDP address driver IC is increased, the permitted current capacity of the metal wiring laid within the PDP address driver IC must be increased because the consumption current inside the PDP address driver IC increases. In other words, it is necessary to increase the line width of high voltage ground wiring 206 and high voltage power wiring 207 in order to increase the permitted current capacity. However, if we simply increase the width of the metal wiring in proportion to the increase in the number of output bit portions, problems such as the following arise.

FIG. 7 is a principal part view illustrating how the disposition of wires of greater width relates to the disposition of the output bit portions. As shown in FIG. 7, high voltage power wiring 213 is disposed outside the region directly above the high-withstand voltage circuit section.

Specifically, if the consumption current of the PDP address driver IC is set at 400 mA, in cases where the current capacity of the metal wiring with respect to width is 2 (mA/μm), high voltage ground wiring 212 and high voltage power wiring 213 would both have to have a metal wiring thickness of 200 μm to correspond to this current capacity. For example, if the region in which the high-withstand voltage circuit section is disposed is 350 μm wide, high voltage power wiring 213 is then placed more than 50 μm from the region directly above the region of the high-withstand voltage circuit section. In other words, high voltage power wiring 213 is then placed over a region in which no active elements are formed.

The present invention is directed to overcoming or at least reducing the effects of one or more of the problems set forth above.

SUMMARY OF THE INVENTION

In order to solve the above problem, there is a method for extending high voltage ground wiring 212 or high voltage power wiring 213 directly above the region in which the logic circuit section indicated by arrow E is disposed. However, a region where logic ground wiring 210 and logic power source wiring 211 are laid must be secured in the layer above the logic circuit section and it is difficult to extend the high voltage ground wiring 212 or high voltage power wiring 213 directly above the region where the logic circuit section is disposed.

Further, a method that involves securing the permitted current capacity by increasing the thickness of the high voltage ground wiring and the high voltage power wiring may also be considered.

However, generally speaking, in cases where the thickness of metal wiring is increased, the interval between the wiring must be widened in order to avoid an inadequate etching process. Hence, in cases where wiring of increased thickness is used for the fine logic signal wiring, the area of the region for forming the logic signal wiring must increase.

Therefore, when an adequate permitted current capacity for the metal wiring is to be secured by means of the constitution shown in FIG. 7, high voltage ground wiring 212 or high voltage power wiring 213 must be disposed so as to extend from the regions of the high withstand voltage circuit section and the logic circuit section as mentioned earlier and, as a result, there has been the problem that the distance in the width direction of the PDP address driver IC increases and the size per unit of the PDP address driver IC increases.

In addition, the width of high voltage ground wiring 206 and high voltage power wiring 207 is adequate in order to secure a stable operation for the high withstand voltage circuit section by means of the constitution shown in FIG. 6A. Hence, the uppermost layer metal wiring is constituted by high voltage ground wiring 206 and high voltage power wiring 207 in the majority of the region for forming the high withstand voltage circuit section. Therefore, output terminals 209 have previously been placed outside the region directly above the region in which the high withstand voltage circuit section is disposed as shown in FIG. 6A. Hence, when output terminals 209 are formed at both ends of the PDP address driver as shown in FIG. 5, there has been the problem that the distance in the width direction of the PDP address driver IC cannot be reduced.

In addition, there has been a problem in the case of the PDP address driver IC 200 shown in FIG. 5. That is, in order to arrange high voltage ground wiring 206 and high voltage power wiring 207 so that they extend within the plane of PDP address driver IC 200, high voltage ground wiring 206 and high voltage power wiring 207 are also disposed in regions where the output terminals are not formed (the regions indicated by arrow F in FIG. 5) at the ends of the PDP address driver IC 200 in the longitudinal direction thereof, and therefore the distance in the longitudinal direction of the PDP address driver IC 200 cannot be reduced.

The present invention was conceived in view of these problems and an object of thereof is to provide a semiconductor integrated circuit that controls the addresses of a display panel with a permitted current capacity that is small yet adequate and with a multiplicity of output bit portions. In order to solve the above problems, the present invention is a semiconductor integrated circuit that drives a display device, wherein a plurality of layers are formed in the semiconductor integrated circuit, each layer being formed by arranging a planar first metal wiring layer that supplies a first potential supplied from the outside to an active element formed in the semiconductor integrated circuit and a planar second metal wiring layer that supplies a second potential supplied from the outside to the active element.

In addition, in the uppermost layer of the plurality of layers, a portion or all of the output terminal of the semiconductor integrated circuit is formed within a region directly above the region in which the active element is formed.

According to the present invention, in the case of a semiconductor integrated circuit that drives a display device, a plurality of layers are formed in the semiconductor integrated circuit by placing a planar first metal wiring layer that supplies a first potential supplied from the outside to an active element formed in the semiconductor integrated circuit and a planar second potential metal wiring layer that supplies a source potential from the outside to the active element.

Accordingly, the semiconductor integrated circuit that controls addresses of a display device can comprise an adequate permitted current capacity while being small-scale and is able to comprise a multiplicity of output bit portions. In addition, in cases where either a portion or all of the output terminal of the semiconductor integrated circuit is formed in a region that is directly above the region in which the active element is formed, a smaller scale can be implemented.

BRIEF DESCRIPTION OF THE DRAWINGS

The foregoing advantages and features of the invention will become apparent upon reference to the following detailed description and the accompanying drawings, of which:

FIG. 2 provides planar views of the principal parts of the PDP address driver IC of the first embodiment, where FIG. 2A is a planar view of the principal parts of the third layer of the laminated structure and FIG. 2B is a planar view of the principal parts of the fourth layer of the laminated structure;

FIG. 4 provides planar views of the principal parts of the PDP address driver IC of the third embodiment, where

FIG. 6 provides principal part views illustrating the constitution of the output bit portion, where

DETAILED DESCRIPTION OF SPECIFIC EMBODIMENTS

Embodiments of the present invention will be described in detail below with reference to the drawings.

In the first embodiment, a layer on which high voltage power wiring and high voltage ground wiring are laid is laminated. Further, in the uppermost layer, a portion or all of the output terminal is formed in a region directly above the active element formation region.

Figure 1:
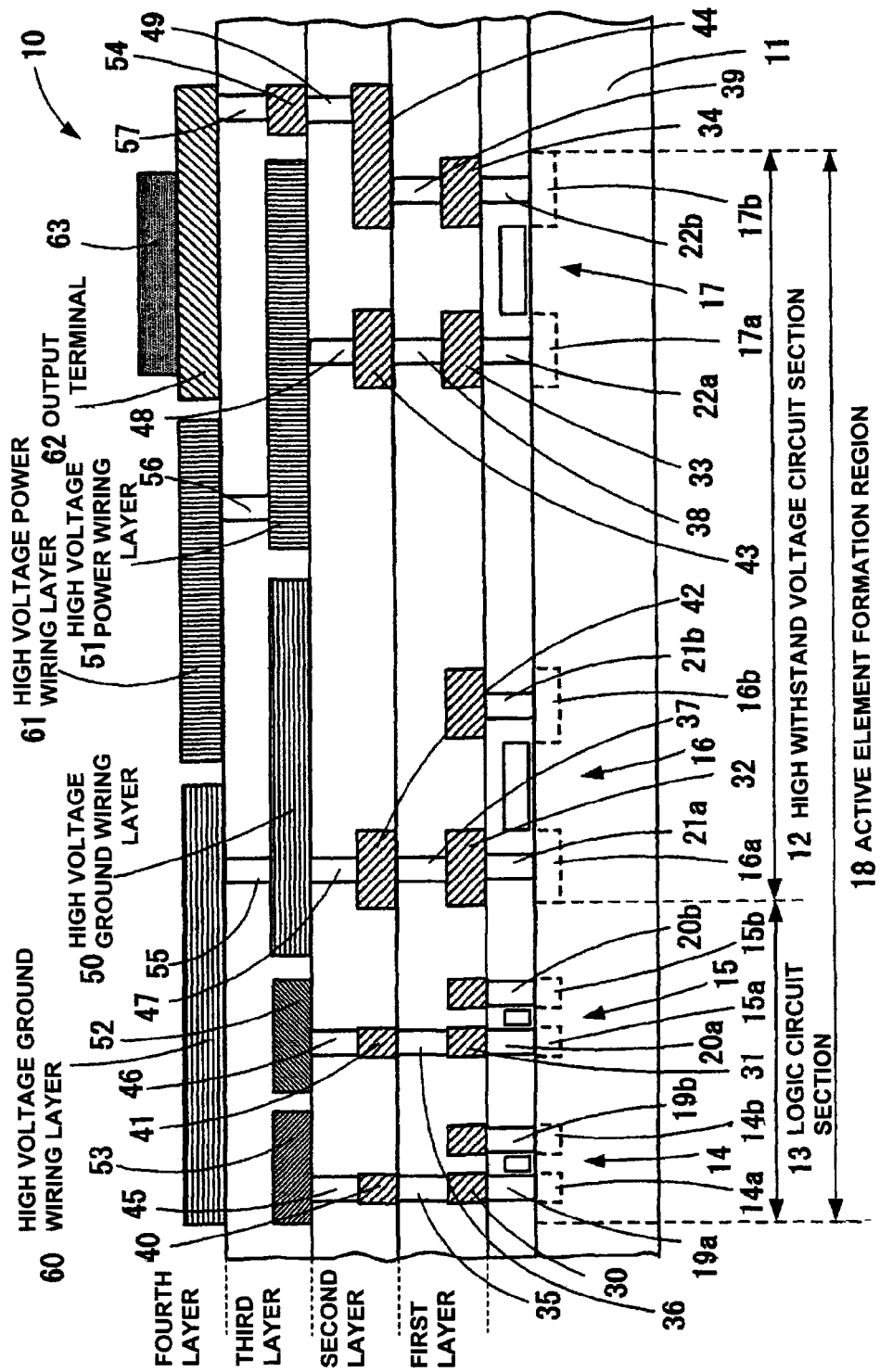
FIG. 1 is a principal part cross-sectional view of the PDP address driver IC of a first embodiment.

FIG. 1 is a principal part cross-sectional view of a PDP address driver IC of the first embodiment. FIG. 1 schematically shows a cross-section of the principal parts of the semiconductor integrated circuit that is formed in one part of output bit portion 10 as viewed from the width direction of the PDP address driver IC. In FIG. 1, only the principal parts of the metal wiring, including the first, second and third layers, are displayed.

High withstand voltage section 12 that outputs signals to the display device, and logic circuit section 13 that controls high withstand voltage circuit section 12, are provided on Si (silicon) substrate 11. High withstand voltage section 12 and logic circuit section 13 form active elements 14, 15, 16, and 17 that constitute respective circuits. Here, the active elements are, for example, MOS (Metal Oxide Semiconductor) transistors and regions where active elements are formed on Si substrate 11 as per high withstand voltage section 12 and logic circuit section 13 are defined as active element formation regions 18.

Plug electrodes 19a, 19b, 20a, 20b, 21a, 21b, 22a, and 22b are formed on respective source/drain regions 14a, 14b, 15a, 15b, 16a, 16b, 17a, and 17b of active elements 14, 15, 16, and 17. Source/drain regions 14a, 15a, 16a, and 17a and each of wiring layers 30, 31, 32, and 33 that are pattern-formed in the first layer of the laminated structure are electrically connected via plug electrodes 19a, 20a, 21a, and 22a. Plug electrodes 35, 36, 37, and 38 are also formed on wiring layers 30, 31, 32, and 33, and wiring layers 40, 41, 42, and 43 that are pattern-formed in the second layer and the respective wiring layers 30, 31, 32, and 33 that are formed in the first layer are electrically connected via plug electrodes 35, 36, 37, and 38.

In the third layer, high voltage ground wiring layer 50 which is a first metal wiring is electrically connected to wiring layer 42 via plug electrode 47. In addition, high voltage power wiring layer 51 which is a second metal wiring is electrically connected to wiring layer 43 via plug electrode 48. Thus, high voltage ground wiring layer 50 and high voltage power wiring layer 51 are placed directly above high withstand voltage section 12. A ground potential is supplied from high voltage ground wiring layer 50 to high withstand voltage section 12 and a high voltage source potential is supplied from high voltage power wiring layer 51 to high withstand voltage section 12.

In addition to high voltage ground wiring layer 50 and high voltage power wiring layer 51 in the third layer, logic ground wiring layer 52 is electrically connected to wiring layer 41 via plug electrode 46. In addition, logic power source wiring layer 53 is electrically connected to wiring layer 40 via plug electrode 45. Thus, logic ground wiring layer 52 and logic power source wiring layer 53 are positioned directly above logic circuit section 13 and a ground potential is supplied from logic ground wiring layer 52 to logic circuit section 13 and a predetermined potential is supplied from logic power source wiring layer 53 to logic circuit section 13. Wiring layer 34 formed on plug electrode 22b and wiring layer 44 are electrically connected via plug electrode 39 and wiring layer 44 is electrically connected to wiring layer 54 via plug electrode 49.

In this embodiment, a fourth layer is also formed on the third layer and high voltage ground wiring layer 60 and high voltage power wiring layer 61 are also placed in the fourth layer. More specifically, high voltage ground wiring layer 60 of the fourth layer is disposed in the layer above logic ground wiring layer 52, logic power source wiring layer 53, and high voltage ground wiring layer 50 that are pattern-formed in the third layer and high voltage ground wiring layer 60 of the fourth layer and high voltage ground wiring layer 50 of the third layer are electrically connected via plug electrode 55. In other words, high voltage ground wiring layer 60 of the fourth layer and high voltage ground wiring layer 50 of the third layer are at the same potential.

In addition, high voltage power wiring layer 61 of the fourth layer is disposed in the layer above high voltage ground wiring layer 50 and high voltage power wiring layer 51 that are pattern-formed in the third layer and high voltage power wiring layer 61 of the fourth layer is electrically connected via plug electrode 56 to high voltage power wiring layer 51 of the third layer. In other words, high voltage power wiring layer 61 of the fourth layer and high voltage power wiring layer 51 of the third layer are at the same potential. Output terminal 62 is electrically connected to wiring layer 54 via plug electrode 57. In addition, bump 63 made of Au (gold) is formed on output terminal 62.

The material used for the metal wiring layers provided in the first to fourth layers is AlCu (an alloy of aluminum and copper), for example. In addition, an interlayer insulating film such as an oxide film is formed between the respective wiring layers of the first to fourth layers.

Thus, in the first embodiment, the high voltage ground wiring layer and high voltage power wiring layer that supply a predetermined potential to high withstand voltage section 12 are positioned in three dimensions divided between a plurality of layers. Because each of these layers is allowed to conduct, the width of the high voltage ground wiring layer and high voltage power wiring layer that supply a predetermined potential to high withstand voltage section 12 is increased without increasing the size of the PDP address driver IC.

A portion of output terminal 62 is formed in the layer above high voltage power wiring layer 51 of the third layer, that is, within a region directly above high withstand voltage section 12. In addition, all of output terminal 62 may also be formed in the layer above high voltage power wiring layer 51 of the third layer, that is, within the region directly above high withstand voltage section 12. Therefore, there is no need for output terminal 62 to be disposed outside the region directly above the region on which the high withstand voltage circuit section shown in FIG. 6 is disposed and the distance in the width direction of the PDP address driver IC can be reduced.

Figure 5:
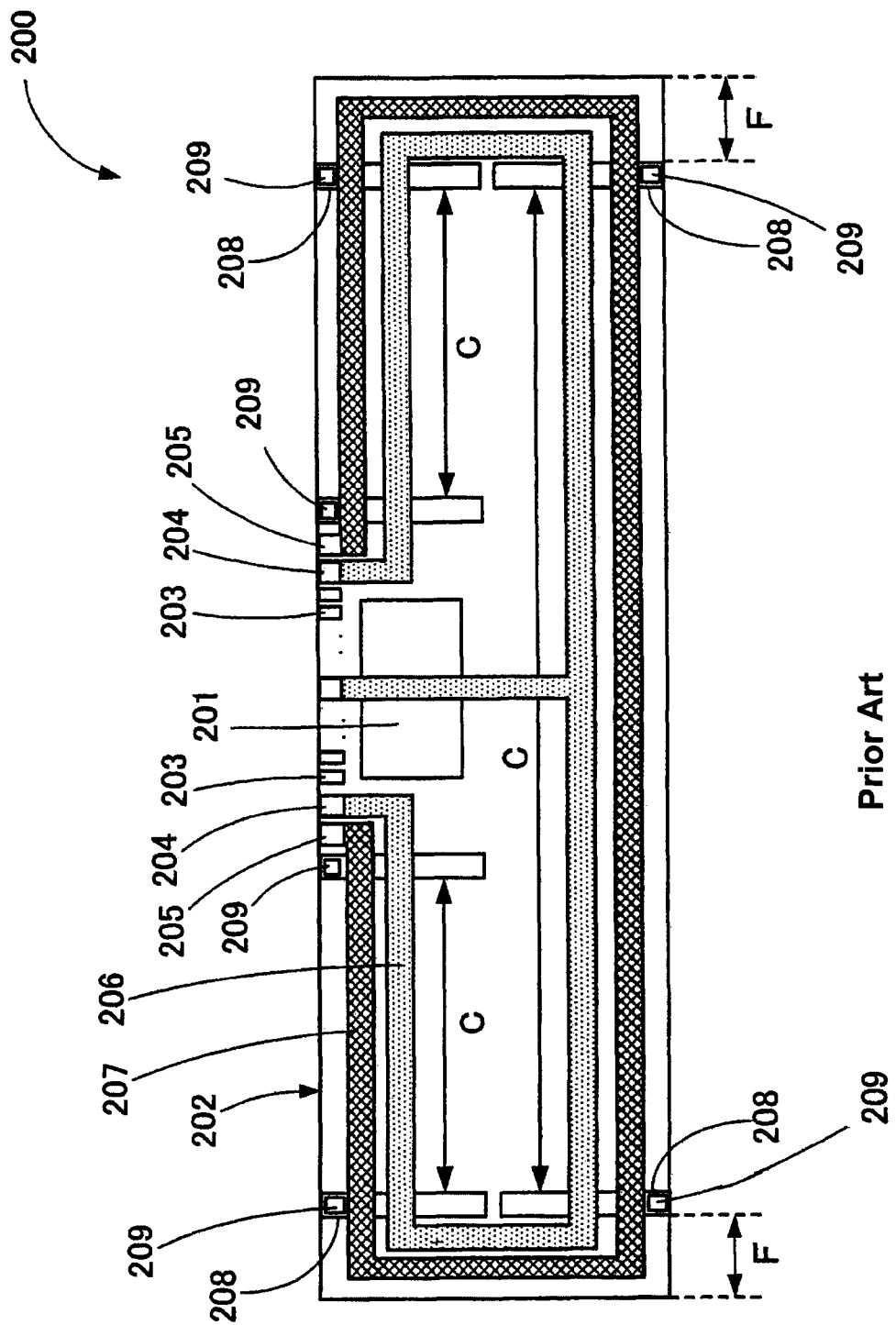
FIG. 5 is a principal part view illustrating the layout of a PDP address driver IC.

If high voltage ground wiring layers 50 and 60 and high voltage power wiring layers 51 and 61 are positioned to form a plurality of layers, although the steps increase in comparison with a case where these layers are formed in a single layer, because the chip can be reduced in size by disposing output terminal 62 directly above the region where high withstand voltage section 12 is disposed, the costs for the overall semiconductor integrated circuit can be reduced in comparison with those for the constitution shown in FIGS. 5 and 6.

The three-dimensional placement of the respective metal wiring layers was described hereinabove based on the cross-section of the principal parts of the semiconductor integrated circuit formed on one part of output bit portion 10. However, in order to permit an understanding of how the metal wiring layers are pattern-formed for the PDP address driver IC as a whole, the three-dimensional placement of the metal wiring layers of the first embodiment will now be illustrated by using a planar view of the whole PDP address driver IC.

FIG. 2 provides planar views of the principal parts of the PDP address driver IC of the first embodiment, where FIG. 2A is a planar view of the principal parts of the third layer of the laminated structure and FIG. 2B is a planar view of the principal parts of the fourth layer of the laminated structure. As shown in FIG. 2, the plane of the PDP address driver IC has a rectangular shape. In addition, the region marked by the dotted line A in FIG. 2 indicates the outer edge of active element formation region 18 provided on Si substrate 11 shown in FIG. 1.

First, the principal part planar structure of the third layer of the PDP address driver IC shown in FIG. 2A will be illustrated. In the third layer of the laminated structure of PDP address driver IC 100, planar high voltage ground wiring layers 50a and 50b that supply a ground potential to the high withstand voltage circuit section (not illustrated) are provided in parallel on both sides in the longitudinal direction of PDP address driver IC 100. Furthermore, planar high voltage power wiring sections 51a and 51b are provided in parallel on both sides in the longitudinal direction of PDP address driver IC 100 so as to adjoin high voltage ground wiring layers 50a and 50b outside high voltage ground wiring layers 50a and 50b. These high voltage ground wiring layers 50a and 50b and high voltage power wiring sections 51a and 51b both lie within the region of the dotted line A and are disposed in an inside region extending from the outer edge of active element formation region 18.

The planar structure of the principal parts of the fourth layer of PDP address driver IC 100 will be described next by using FIG. 2B. In the fourth layer of the laminated structure of PDP address driver IC 100, planar high voltage ground wiring layer 60 is disposed on the center line in the longitudinal direction of PDP address driver IC 100. Further, high voltage ground wiring layer 60, and high voltage ground wiring layers 50a and 50b that are disposed in the third layer shown in FIG. 2A are made to conduct by means of vias (not illustrated) that are formed between the third and fourth layers.

Planar high voltage power wiring layer 61 extends outside high voltage ground wiring layer 60 so as to surround high voltage ground wiring layer 60. High voltage power wiring layer 61 and high voltage power wiring layers 51a and 51b that are disposed in the third layer shown in FIG. 2A are made to conduct by means of vias (not shown) that are formed between the third and fourth layers.

High voltage ground wiring layer 60 and high voltage power wiring layer 61 are within the region marked by the dotted line A and disposed in an inside region extending from the outer edge of active element formation region 18. Further, a portion or all of output terminal 62 is formed inside a region directly above active element formation region 18. Here, arrow B shown in FIG. 2 signifies the fact that output terminal 62 is disposed without a gap also within the range of arrow B.

Terminals 70a and 70b each extend from high voltage ground wiring layer 60 and high voltage power wiring layer 61, and a portion or all of terminals 70a and 70b are formed within a region directly above active element formation region 18.

Thus, in PDP address driver IC 100, a plurality of layers are formed, each layer having planar high voltage ground wiring layers 50a, 50b and 60 that supply a ground potential from the outside to the active element formed in the semiconductor integrated circuit and planar high voltage power wiring layers 51a, 51b and 61 that supply a source potential from the outside to the active element laid therein, with the layers being positioned within the semiconductor integrated circuit. High voltage ground wiring layers 50a, 50b and 60 and high voltage power wiring layers 51a, 51b, and 61 are disposed within a region directly above active element formation region 18.

With PDP address driver IC 100, high voltage ground wiring layers 50a, 50b, and 60 and high voltage power wiring layers 51a, 51b, and 61 are positioned in three dimensions in the third and fourth layers. Hence, an adequate line width is preserved by high voltage ground wiring layers 50a, 50b, and 60 and high voltage power wiring layers 51a, 51b, and 61.

As a result, the distance in the width direction of PDP address driver IC 100 is not increased even when the line width of the high voltage ground wiring layers and high voltage power wiring layers are enlarged in order to preserve an adequate permitted current capacity. More particularly, in cases where high voltage ground wiring layers 50a, 50b, and 60 and high voltage ground wiring layers 51a, 51b, and 61 are positioned in the third and fourth layers, the line width can also be kept at half or less the respective line widths in cases where the high voltage ground wiring layers and high voltage power wiring layers are positioned only in the third layer. Further, as a result of the respective line widths of high voltage ground wiring layers 50a and 50b and high voltage power wiring layers 51a and 51b being reduced in the third layer, other wiring patterns (logic ground wiring layer 52 and logic power source wiring layer 53, for example) can also be arranged in the newly produced vacant region.

In addition, the parasitic resistance of high voltage ground wiring layers 50a, 50b, and 60 decreases further as a result of the adequate line width of high voltage ground wiring layers 50a, 50b, and 60 and a stable ground potential can be supplied to the active element. As a result, erroneous operation of the output signal of PDP address driver IC 100 can be reduced further.

A portion or all of output terminal 62 is formed in the layer above high voltage power wiring layer 51 of the third layer, that is, in a region directly above active element formation region 18. Therefore, it is no longer necessary for output terminal 62 to be disposed outside a region directly above a region in which the high withstand voltage circuit section shown in FIG. 6 is disposed and the distance in the width direction of the PDP address driver IC can be reduced. As a result, miniaturization of the PDP address driver IC can be achieved.

In the case of PDP address driver IC 200 shown in FIG. 5, high voltage ground wiring 206 and high voltage power wiring 207 are also disposed in a region where the output terminal has not been formed (the region indicated by arrow F in FIG. 5) at the end in longitudinal direction of the PDP address driver IC 200. That is, high voltage ground wiring 206 and high voltage power wiring 207 are disposed in a region where the active element is not formed.

However, in the case of PDP address driver IC 100 shown in FIGS. 1 and 2, because high voltage ground wiring layers 50a, 50b, and 60 and high voltage power wiring layers 51a, 51b, and 61 are disposed in regions where the active element is formed in the third and fourth layers, there is no need to extend the high voltage ground wiring layers and high voltage power wiring layers around the region of the range indicated by arrow F shown in FIG. 5. As a result, the distance in the longitudinal direction of the PDP address driver IC can be reduced. As a result, miniaturization of the PDP address driver IC can be achieved.

The second embodiment will be described next. In the following description, elements that are the same as the elements shown in FIGS. 1 and 2 are assigned the same reference numerals and, therefore, a detailed description of such elements is omitted here. Further, in this embodiment, the constitution of the third layer is the same as the structure of the third layer of the first embodiment shown in FIG. 2A. Hence, drawings and a detailed description thereof are omitted.

Figure 3:
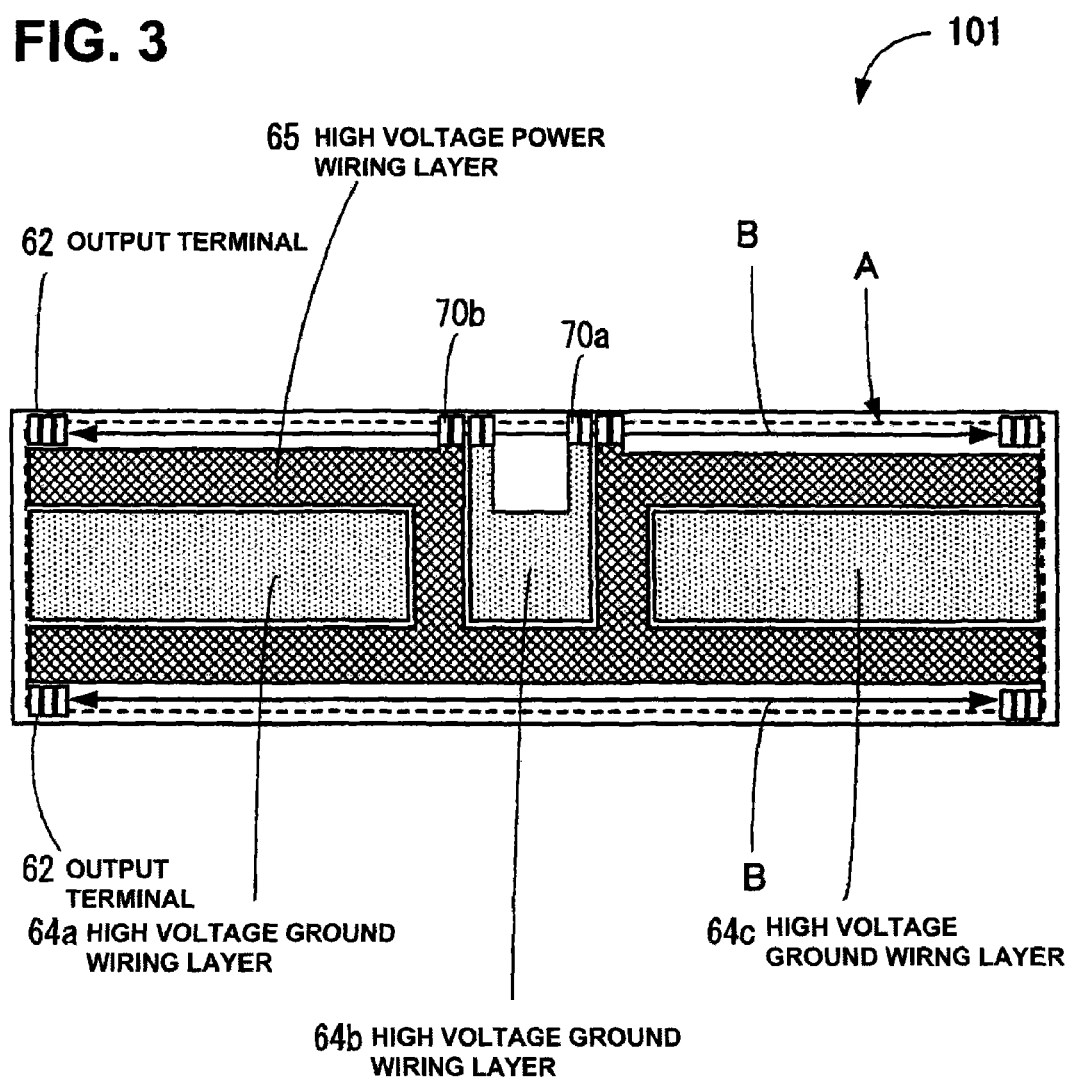
FIG. 3 is a planar view of the principal parts the PDP address driver IC of the second embodiment.

FIG. 3 is a planar view of the principal parts of the PDP address driver IC of the second embodiment. The region marked by the dotted line A in FIG. 3 shows the outer edge of active element formation region 18 provided on Si substrate 11 shown in FIG. 1.

In the fourth layer of the laminated structure of PDP address driver IC 101, planar high voltage ground wiring layers 64a, 64b, and 64c are disposed on the center line in the longitudinal direction of PDP address driver IC 101. These high voltage ground wiring layers 64a, 64b, and 64c are made to conduct and are at the same potential. Further, high voltage ground wiring layers 64a, 64b, and 64c and high voltage ground wiring layers 50a and 50b disposed in the third layer shown in FIG. 2A are made to conduct by means of vias (not shown) that are formed between the third and fourth layers.

Planar high voltage power wiring layer 65 is disposed at both ends of high voltage ground wiring layers 64a and 64c or at one end of high voltage ground wiring layer 64b. In addition, a portion of high voltage power wiring layer 65 is positioned across the gap between high voltage ground wiring layer 64a and high voltage ground wiring layer 64b and across the gap between high voltage ground wiring layer 64c and high voltage ground wiring layer 64b, such that high voltage power wiring layers 65 disposed at both ends of high voltage ground wiring layers 64a and 64c are made conductive. High voltage power wiring layer 65 and high voltage power wiring layers 51a and 51b disposed in the third layer shown in FIG. 2A are made to conduct by means of vias (not shown) that are formed between the third and fourth layers. These high voltage ground wiring layers 64a, 64b, and 64c and high voltage power wiring layer 65 are disposed within the region marked by the dotted line A and in an outer region extending from the outer edge of active element formation region 18.

A portion or all of output terminal 62 is formed in a region directly above active element formation region 18. Here, arrow B shown in FIG. 3 signifies the fact that output terminal 62 is also disposed without a gap in the range of arrow B.

Thus, in the case of PDP address driver IC 101, a plurality of layers are formed, each layer having planar high voltage ground wiring layers 50a, 50b, 64a, 64b, and 64c that supply a ground potential to an active element formed in the semiconductor integrated circuit and planar high voltage power wiring layers 51a, 51b, and 65 that supply a source potential to the active element laid therein, with the layers being within the semiconductor integrated circuit.

High voltage ground wiring layers 50a, 50b, 64a, 64b, and 64c and high voltage power wiring layers 51a, 51b, and 65 are disposed within a region directly above active element formation region 18. With PDP address driver IC 101, high voltage ground wiring layers 50a, 50b, 64a, 64b, and 64c and high voltage power wiring layers 51a, 51b, and 65 are laid in three dimensions in the third and fourth layers. Hence, an adequate line width is preserved by high voltage ground wiring layers 50a, 50b, 64a, 64b, and 64c and high voltage power wiring layers 51a, 51b, and 65.

As a result, the distance in the width direction of PDP address driver IC 101 is not increased even when the line width of the high voltage ground wiring layers and high voltage power wiring layers are enlarged in order to preserve an adequate permitted current capacity. More particularly, in cases where high voltage ground wiring layers 50a, 50b, 64a, 64b, and 64c and high voltage ground wiring layers 51a, 51b, and 65 are positioned in the third and fourth layers, the line width can also be kept at half or less the respective line widths in cases where the high voltage ground wiring layers and high voltage power wiring layers are laid only in the third layer.

As a result of the respective line widths of high voltage ground wiring layers 50a and 50b and high voltage power wiring layers 51a and 51b being reduced in the third layer, other wiring patterns (logic ground wiring layer 52 and logic power source wiring layer 53, for example) can also be arranged in the newly produced vacant region. In addition, the parasitic resistance of high voltage ground wiring layers 50a, 50b, and 60 decreases further as a result of the adequate line width of high voltage ground wiring layers 50a, 50b, and 64a, 64b, and 64c and a stable ground potential can be supplied to the active element. As a result, erroneous operation of the output signal of PDP address driver IC 101 can be reduced further.

A portion or all of output terminal 62 is formed in the layer above high voltage power wiring layer 51 of the third layer, that is, in a region directly above active element formation region 18. Therefore, it is no longer necessary for output terminal 62 to be disposed outside a region directly above a region in which the high withstand voltage circuit section shown in FIG. 6 is disposed and the distance in the width direction of the PDP address driver IC can be reduced. As a result, miniaturization of the PDP address driver IC can be achieved.

In the case of PDP address driver IC 200 shown in FIG. 5, high voltage ground wiring 206 and high voltage power wiring 207 are also disposed in a region where the output terminal has not been formed (the region indicated by arrow F in FIG. 5) at the end in the longitudinal direction of PDP address driver IC 200. That is, high voltage ground wiring 206 and high voltage power wiring 207 are disposed in a region where the active element is not formed.

However, in the case of PDP address driver IC 101 shown in FIG. 3, because high voltage ground wiring layers 50a, 50b, 64a, 64b, and 64c and high voltage power wiring layers 51a, 51b, and 65 are disposed in regions where the active element is formed in the third and fourth layers, there is no need to extend the high voltage ground wiring layers and high voltage power wiring layers around regions of the range indicated by arrow F shown in FIG. 5. As a result, the distance in the longitudinal direction of the PDP address driver IC can be reduced. As a result, miniaturization of the PDP address driver IC can be achieved.

The third embodiment will be described next. In the following description, elements that are the same as the elements shown in FIGS. 1 to 3 are assigned the same reference numerals and, therefore, a detailed description of such elements is omitted here. The region marked by dotted line A in FIG. 4 indicates the outer edge of active element formation region 18 provided on Si substrate 11 shown in FIG. 1.

Figure 4A:
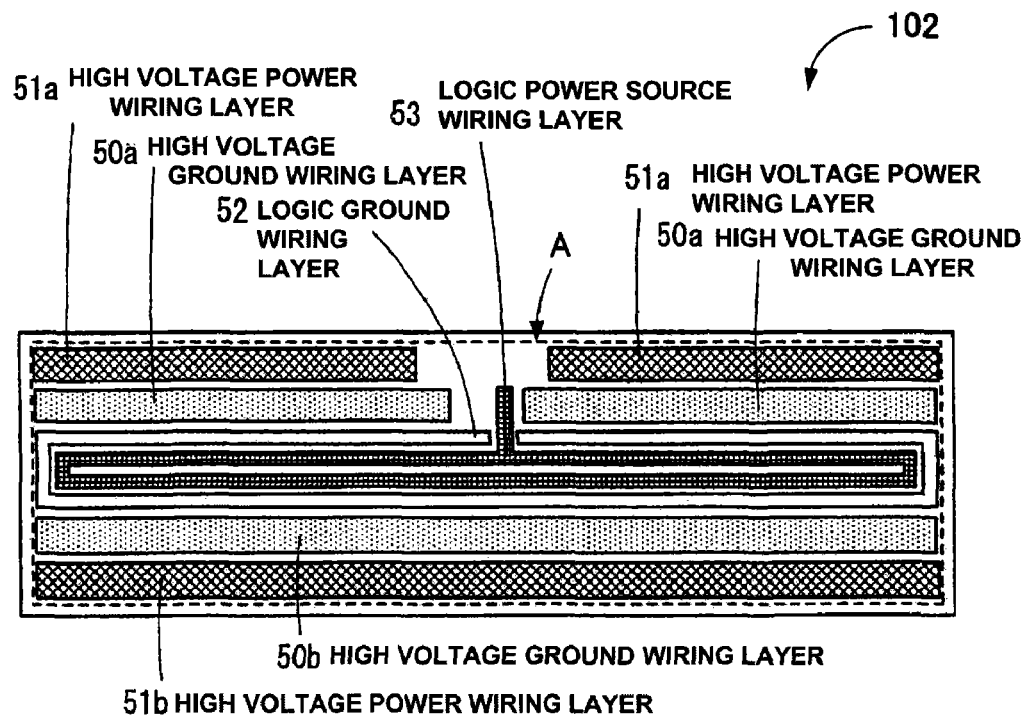
FIG. 4A is a planar view of the principal parts of the third layer of the laminated structure and FIG. 4B is a planar view of the principal parts of the fourth layer of the laminated structure.
Figure 4B:
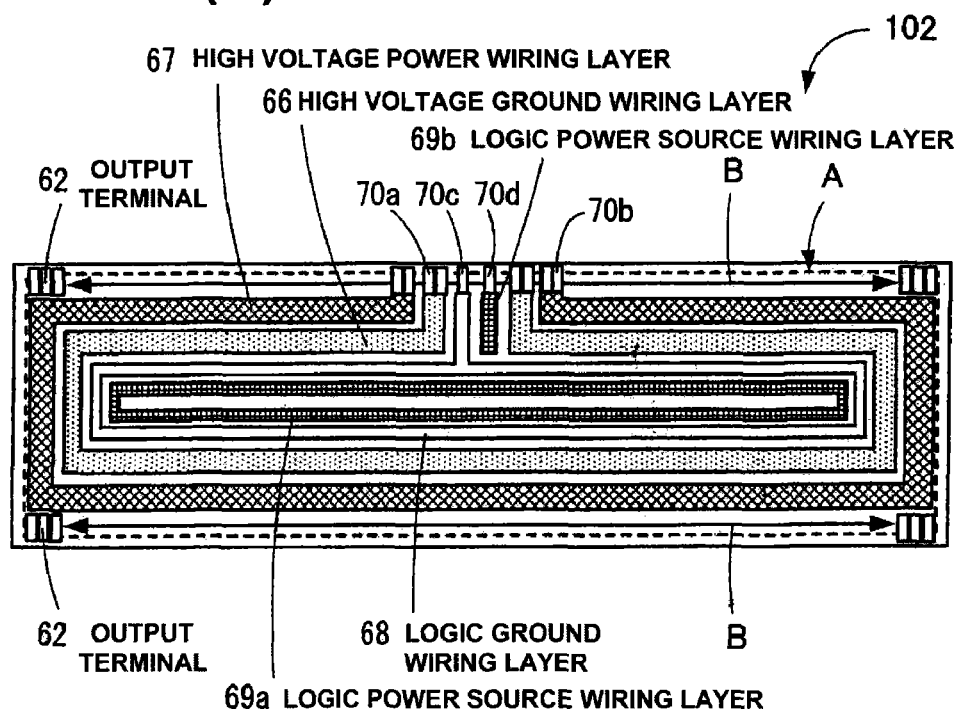

FIG. 4 provides planar views of the principal parts of the PDP address driver IC of the third embodiment, where FIG. 4A is a planar view of the principal parts of the third layer of the laminated structure and FIG. 4B is a planar view of the principal parts of the fourth layer of the laminated structure.

First, the planar structure of the principal parts of the third layer of the PDP address driver IC shown in FIG. 4A will be described. In the third layer of the laminated structure of PDP address driver IC 102, planar high voltage ground wiring layers 50a and 50b that supply a ground potential to the high withstand voltage circuit section (not illustrated) are provided in parallel on both sides in the longitudinal direction of PDP address driver IC 102. Furthermore, planar high voltage power wiring sections 51a and 51b are provided in parallel on both sides in the longitudinal direction of PDP address driver IC 102 so as to join high voltage ground wiring layers 50a and 50b. High voltage ground wiring layers 50a and 50b and high voltage power wiring sections 51a and 51b both lie within the region of the dotted line A and are disposed in an inside region extending from the outer edge of active element formation region 18.

Logic ground wiring layer 52 (third metal wiring) that supplies a ground potential to the logic circuit section (not illustrated) extends around the region between high voltage ground wiring section 50a and high voltage ground wiring layer 50b. In addition, logic power source wiring layer 53 (fourth metal wiring) that supplies a source potential to the logic circuit section (not shown) extends around the region that is surrounded by logic ground wiring layer 52.

The planar structure of the principal parts of the fourth layer of PDP address driver IC 102 will be described next by using FIG. 4B. In the fourth layer of the laminated structure of PDP address driver IC 102, planar high voltage ground wiring layer 66 extends around the region directly above active element formation region 18. High voltage ground wiring layer 66 and the high voltage ground wiring layers 50a and 50b that are disposed in the third layer shown in FIG. 4A are made to conduct by means of vias (not illustrated) that are formed between the third and fourth layers.

Planar high voltage power wiring layer 67 extends outside high voltage ground wiring layer 66. Further, high voltage power wiring layer 67 and high voltage power wiring layers 51a and 51b that are disposed in the third layer shown in FIG. 4A are made to conduct by means of vias (not shown) that are formed between the third and fourth layers.

High voltage ground wiring layer 66 and high voltage power wiring layer 67 extend within the plane of PDP address driver IC 102 within the region marked by the dotted line A and disposed in an inside region extending from the outer edge of active element formation region 18.

Logic ground wiring layer 68 extends within the region surrounded by high voltage wiring layer 66. Further, logic ground wiring layer 68 and logic ground wiring layer 52 that is disposed in the third layer shown in FIG. 4A are made to conduct by means of vias (not shown) that are formed between the third and fourth layers.

Logic power source wiring layer 69a extends around the region surrounded by logic ground wiring layer 68. Further, logic power source wiring layer 69b is disposed in the center of PDP address driver IC 102. Logic power source wiring layers 69a and 69b and logic power source wiring layer 53 that is disposed in the third layer shown in FIG. 4A are made to conduct by means of vias (not shown) that are formed between the third and fourth layers.

A portion or all of output terminal 62 is formed in a region directly above active element formation region 18. Here, arrows B shown in FIG. 4 signify the fact that output terminal 62 is also disposed without a gap in the range of the arrow B. In addition, terminals 70c and 70d extend from logic ground wiring layer 68 and logic power source wiring layer 69b and a portion or all of terminals 70c and 70d is formed within a region directly above active element formation region 18.

Thus, in PDP address driver IC 102, a plurality of layers are formed, each layer having planar high voltage ground wiring layers 50a, 50b and 66 that supply a ground potential to the active element formed in the semiconductor integrated circuit and planar high voltage power wiring layers 51a, 51b and 67 that supply a source potential to the active element positioned therein, the layers being within the semiconductor integrated circuit. High voltage ground wiring layers 50a, 50b and 66 and high voltage power wiring layers 51a, 51b, and 67 are disposed within a region directly above active element formation region 18.

With PDP address driver IC 102, high voltage ground wiring layers 50a, 50b, and 66 and high voltage power wiring layers 51a, 51b, and 67 are positioned in three dimensions in the third and fourth layers. Hence, an adequate line width is preserved by high voltage ground wiring layers 50a, 50b, and 66 and high voltage power wiring layers 51a, 51b, and 67.

As a result, the distance in the width direction of PDP address driver IC 102 is not increased even when the line width of the high voltage ground wiring layers and high voltage power wiring layers are enlarged in order to preserve an adequate permitted current capacity. More particularly, in cases where high voltage ground wiring layers 50a, 50b, and 66 and high voltage ground wiring layers 51a, 51b, and 67 are laid in the third and fourth layers, the line width can also be kept at half or less the respective line widths in cases where the high voltage ground wiring layers and high voltage power wiring layers are laid only in the third layer.

In addition, the parasitic resistance of high voltage ground wiring layers 50a, 50b, and 66 decreases further as a result of the adequate line width of high voltage ground wiring layers 50a, 50b, and 66 and a stable ground potential can be supplied to the active element. As a result, erroneous operation of the output signal of PDP address driver IC 102 can be reduced further.

Further, in this embodiment, logic ground wiring layer 68 and logic power source wiring layers 69a and 69b are disposed in the fourth layer in addition to the third layer. Therefore, an adequate permitted current capacity can also be secured for the logic ground wiring layer and logic power source wiring layer. As a result, erroneous operation of the logic circuit section can be reduced further.

A portion or all of output terminals 62 are formed in the layer above the high voltage power wiring layer 51 of the third layer, that is, in a region directly above the active element formation region 18. Therefore, it is no longer necessary for output terminal 62 to be disposed outside a region directly above a region in which the high withstand voltage circuit section shown in FIG. 6 is disposed and the distance in the width direction of the PDP address driver IC can be reduced. As a result, miniaturization of the PDP address driver IC can be achieved.

In addition, in the case of PDP address driver IC 200 shown in FIG. 5, high voltage ground wiring 206 and high voltage power wiring 207 are also disposed in regions where the output terminals are not formed (the regions indicated by arrow F in FIG. 5) at the ends in the longitudinal direction of PDP address driver IC 200. That is, high voltage ground wiring 206 and high voltage power wiring 207 are disposed in regions where the active element is not formed.

However, in the case of PDP address driver IC 100 shown in FIGS. 1 and 2, because high voltage ground wiring layers 50a, 50b, and 66 and high voltage power wiring layers 51a, 51b, and 67 are disposed in regions where the active element is formed in the third and fourth layers, there is no need to extend the high voltage ground wiring layers and high voltage power wiring layers around the regions of the range indicated by arrow F shown in FIG. 5. As a result, the distance in the longitudinal direction of the PDP address driver IC can be reduced. As a result, miniaturization of the PDP address driver IC can be achieved.

Although a laminated structure limited to four layers was described in the abovementioned first to third embodiments, the number of layers is not limited to this number. The number of layers may also be increased in accordance with the number of output bits provided within the PDP address driver IC and the permitted current capacity of the metal wiring may also be increased by increasing the line width of the metal wiring. Moreover, although high voltage power wiring layers 51a and 51b were described as being formed outside high voltage ground wiring layers 50a and 50b, for example, in the first to third embodiments, high voltage power wiring layers 51a and 51b may also be formed with their placement positions switched. In cases where high voltage ground wiring layers 50a and 50b are formed outside the semiconductor integrated circuit with their positions switched, the positions for forming high voltage ground wiring layer 60 and high voltage power wiring layer 61 which are formed above high voltage ground wiring layers 50a and 50b must also be switched.

Although logic ground wiring layer 52 was described as being formed outside logic power source wiring layer 53 in the first to third embodiments, the positions for forming logic ground wiring layer 52 and logic power source wiring layer 53 may also be switched.

Thus, a semiconductor integrated circuit has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

Figure 6A:
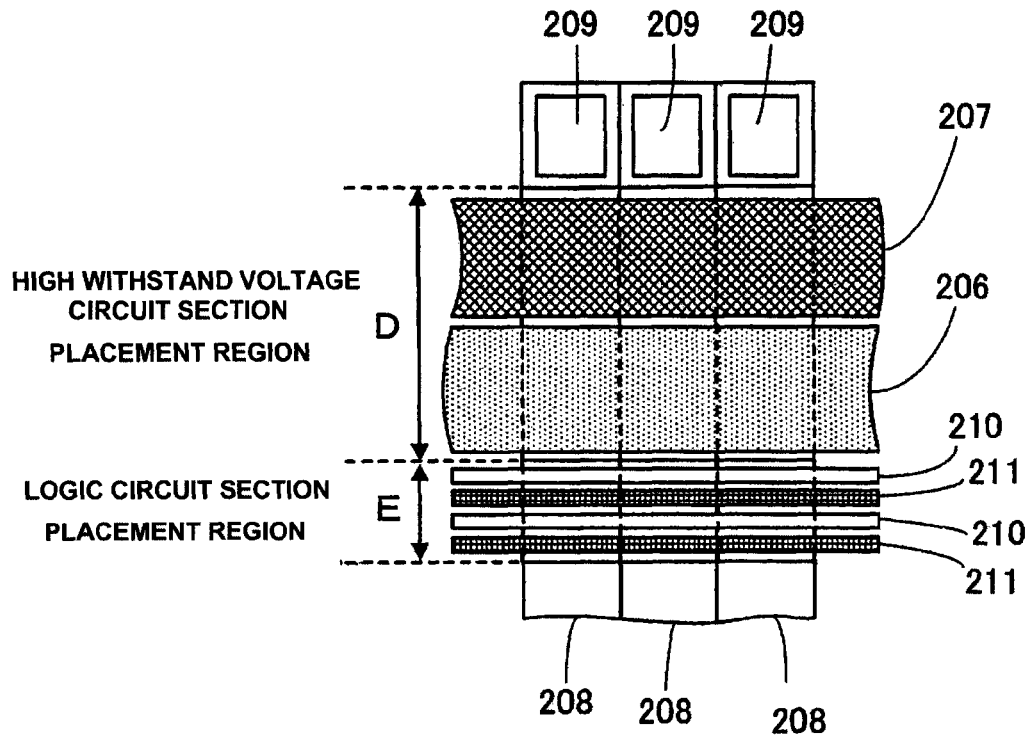
FIG. 6A is a layout diagram of the output bit portion and FIG. 6B is a constitutional view of the circuit of the output bit portion.
Figure 6B:
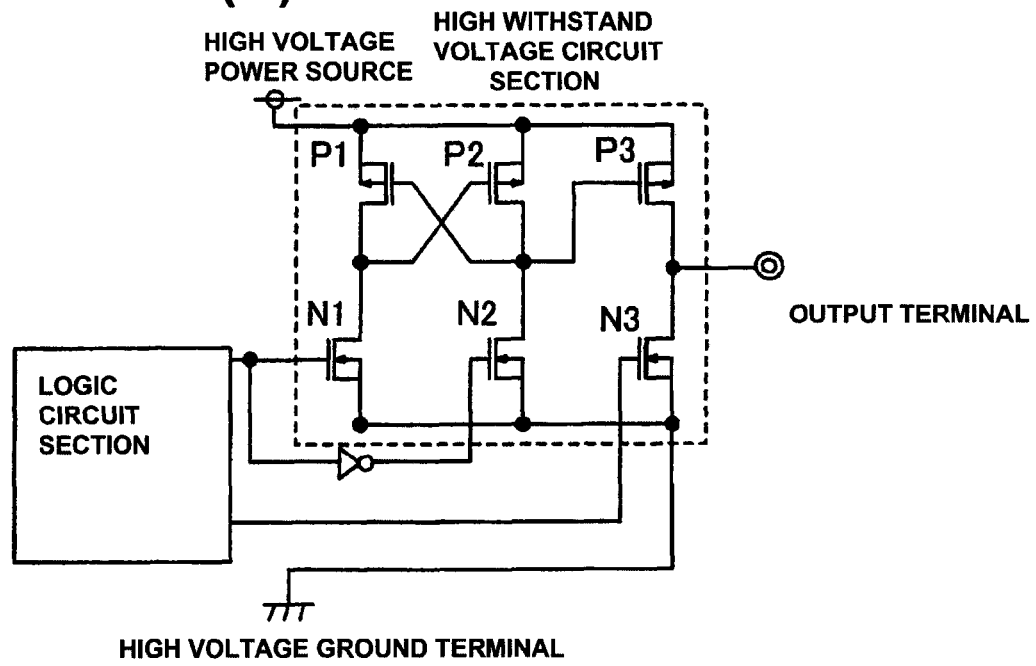
Figure 7:
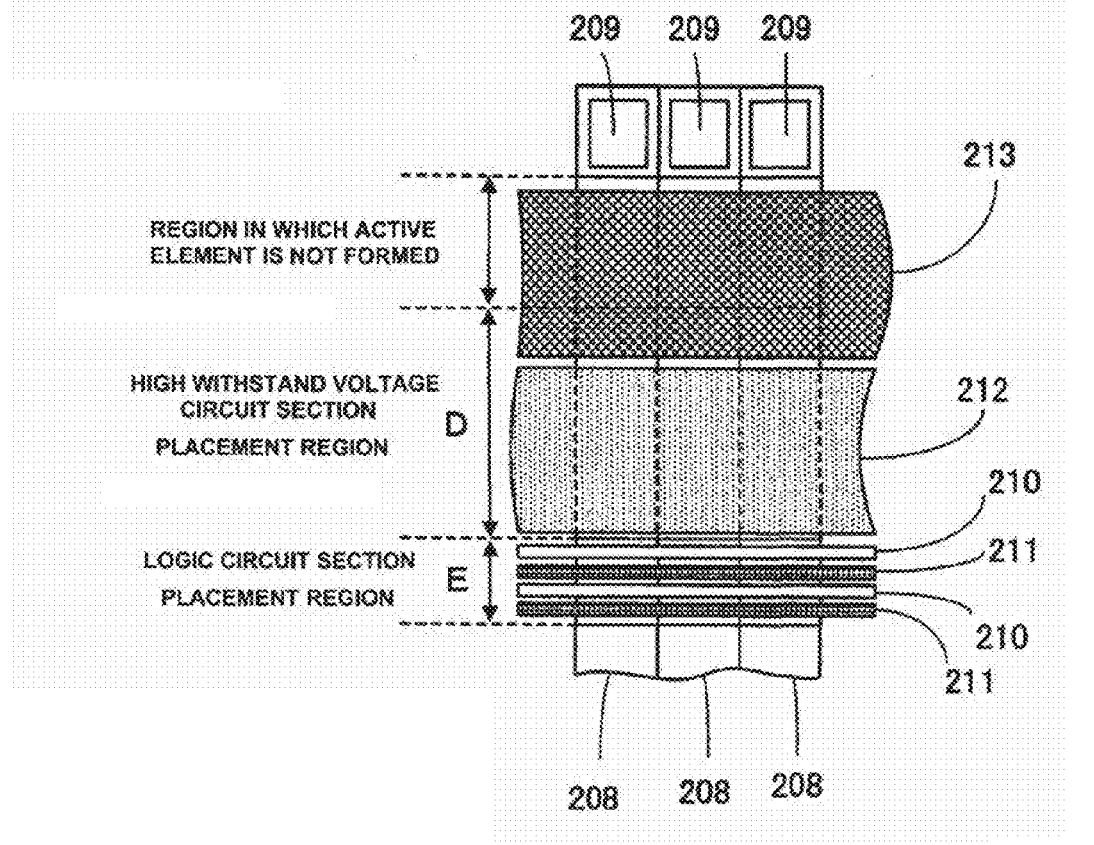
FIG. 7 is a principal part view illustrating how the disposition of wires of greater width relates to the disposition of the output bit portions.

FIG. 1
60 high voltage ground wiring layer
62 high voltage power wiring layer
50 output terminal
51 high voltage ground wiring layer
high voltage power wiring layer
fourth layer
third layer
second layer
first layer
13 logic circuit section
12 high withstand voltage circuit section
18 active element formation region FIG. 2a
51a high voltage power wiring layer
51a high voltage power wiring layer
50a high voltage ground wiring layer
50a high voltage ground wiring layer
51b high voltage power wiring layer
50b high voltage ground wiring layer FIG. 2b
61 high voltage power wiring layer
62 output terminal
62 output terminal
60 high voltage ground wiring layer FIG. 3
62 output terminal
65 high voltage power wiring layer
62 output terminal
64a high voltage ground wiring layer
64b high voltage ground wiring layer
64c high voltage ground wiring layer FIG. 4a
51a high voltage power wiring layer
50a high voltage ground wiring layer
53 logic power source wiring layer
52 logic ground wiring layer
51a high voltage power wiring layer
50a high voltage ground wiring layer
50b high voltage ground wiring layer
51b high voltage power wiring layer FIG. 4b
67 high voltage power wiring layer
66 high voltage ground wiring layer
62 output terminal
69b logic power source wiring layer
62 output terminal
68 logic ground wiring layer
69a logic power source wiring layer FIG. 6a
high withstand voltage circuit section placement region
logic circuit section placement region FIG. 6b
high voltage power source
high withstand voltage circuit section
output terminal
logic circuit section
high voltage ground terminal FIG. 7
region in which active element is not formed
high withstand voltage circuit section placement region
logic circuit section placement region

What is claimed is:

1. A semiconductor integrated circuit that drives a display device, wherein an active element is formed in the semiconductor integrated circuit, a plurality of layers are formed in the semiconductor integrated circuit, each layer being formed by arranging a planar first metal wiring layer, formed on a region where the active element is formed, that supplies a first potential supplied from outside to an active element formed in the semiconductor integrated circuit and a planar second metal wiring layer, formed on the region where the active element is formed, that supplies a second potential supplied from outside to the active element and wherein:

the planar shape of the semiconductor integrated circuit is a rectangular shape;

the first metal wiring layer on the lowermost layer of the plurality of layers is disposed on both sides of the semiconductor integrated circuit in the longitudinal direction thereof and the second metal wiring layer on the lowermost layer is disposed on both sides of the semiconductor integrated circuit in the longitudinal direction thereof and adjoining the first metal wiring layer on the outer side of the first metal wiring layer;

the second metal wiring layer on the uppermost layer of the plurality of layers is disposed such that its peripheral edge is positioned, in the longitudinal direction of the semiconductor integrated circuit, at an inner side of the semiconductor integrated circuit than the peripheral edge of the second metal wiring layer on the lowermost layer, the first metal wiring layer on the uppermost layer is disposed on, in the longitudinal direction of the semiconductor integrated circuit, the inner side of the semiconductor integrated circuit than the second wiring layer on the uppermost layer, and a portion or all of the output terminals of the semiconductor integrated circuit are formed on, in the longitudinal direction of the semiconductor integrated circuit, an outer side of the second metal wiring layer on the uppermost layer within a region directly above the region in which the active element is formed.

2. The semiconductor integrated circuit according to claim 1, wherein:
the first metal wiring layer on the uppermost layer of the plurality of layers is disposed on the center line in the longitudinal direction of the semiconductor integrated circuit and the second metal wiring layer on the uppermost layer surrounds the first metal wiring layer on the uppermost layer.

3. The semiconductor integrated circuit according to claim 2, wherein the third metal wiring layer is metal wiring that supplies a ground potential to a logic circuit that is formed on the semiconductor integrated circuit and the fourth metal wiring layer is metal wiring that supplies a source potential to a logic circuit that is formed on the semiconductor integrated circuit.

4. The semiconductor integrated circuit according to claim 2, wherein the circuit constituted by the active element is a high withstand voltage circuit.

5. The semiconductor integrated circuit according to claim 2, wherein the first potential is the ground potential and the second potential is the source potential.

6. The semiconductor integrated circuit according to claim 1, wherein:
the first metal wiring layer on the uppermost layer of the plurality of layers is disposed on the center line in the longitudinal direction of the semiconductor integrated circuit and a portion of the second metal wiring layer on the uppermost layer crosses the first metal wiring layer on the uppermost layer on both sides of the first metal wiring layer on the uppermost layer.

7. The semiconductor integrated circuit according to claim 6, wherein the third metal wiring layer is metal wiring that supplies a ground potential to a logic circuit that is formed on the semiconductor integrated circuit and the fourth metal wiring layer is metal wiring that supplies a source potential to a logic circuit that is formed on the semiconductor integrated circuit.

8. The semiconductor integrated circuit according to claim 6, wherein the circuit constituted by the active element is a high withstand voltage circuit.

9. The semiconductor integrated circuit according to claim 6, wherein the first potential is the ground potential and the second potential is the source potential.

10. The semiconductor integrated circuit according to claim 1, wherein:
the first metal wiring layer on the uppermost layer of the plurality of layers extends within the plane of the semiconductor integrated circuit, the second metal wiring layer on the uppermost layer extends within a region that is surrounded by the first metal wiring layer, a third metal wiring layer on the uppermost layer extends within a region that is surrounded by the second metal wiring layer, and a fourth metal wiring layer on the uppermost layer extends within a region that is surrounded by the third metal wiring layer; and
the third metal wiring layer on the lowermost layer extends between the first metal wiring layers disposed on both sides thereof, and the fourth metal wiring layer on the lowermost layer extends within a region that is surrounded by the third metal wiring layer.

11. The semiconductor integrated circuit according to claim 10, wherein the third metal wiring layer is metal wiring that supplies a ground potential to a logic circuit that is formed on the semiconductor integrated circuit and the fourth metal wiring layer is metal wiring that supplies a source potential to a logic circuit that is formed on the semiconductor integrated circuit.

12. The semiconductor integrated circuit according to claim 10, wherein the circuit constituted by the active element is a high withstand voltage circuit.

13. The semiconductor integrated circuit according to claim 10, wherein the first potential is the ground potential and the second potential is the source potential.

14. The semiconductor integrated circuit according to claim 1, wherein the circuit constituted by the active element is a high withstand voltage circuit.

15. The semiconductor integrated circuit according to claim 1, wherein the third metal wiring layer is metal wiring that supplies a ground potential to a logic circuit that is formed on the semiconductor integrated circuit and the fourth metal wiring layer is metal wiring that supplies a source potential to a logic circuit that is formed on the semiconductor integrated circuit.

16. The semiconductor integrated circuit according to claim 1, wherein the first potential is the ground potential and the second potential is the source potential.

* * * * *